United States Patent
Miller et al.

(10) Patent No.: US 6,261,868 B1
(45) Date of Patent: Jul. 17, 2001

(54) SEMICONDUCTOR COMPONENT AND METHOD FOR MANUFACTURING THE SEMICONDUCTOR COMPONENT

(75) Inventors: Gerald R. Miller, Scottsdale; Lakshminarayan Viswanathan, Phoenix, both of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/285,827

(22) Filed: Apr. 2, 1999

(51) Int. Cl.[7] .......................... H01L 21/44; H01L 21/48; H01L 21/50
(52) U.S. Cl. .......................... 438/123; 438/122; 257/728
(58) Field of Search .................... 438/122, 123; 257/719, 718, 728

(56) References Cited

U.S. PATENT DOCUMENTS

| | | | |
|---|---|---|---|
| 3,941,916 | 3/1976 | Morse | 174/52 FP |
| 4,455,448 | 6/1984 | Bertolina | 326/757 |
| 4,546,374 | 10/1985 | Olsen et al. | 357/71 |
| 4,627,533 | 12/1986 | Pollard | 206/328 |
| 4,837,664 | 6/1989 | Rodriguez, II et al. | 361/386 |
| 5,023,398 | 6/1991 | Mahulikar et al. | 174/52.4 |
| 5,111,277 | 5/1992 | Medeiros, III et al. | 357/74 |
| 5,216,806 | 6/1993 | Lam | 29/848 |
| 5,232,143 | 8/1993 | Buxton | 228/6.2 |
| 5,239,131 | 8/1993 | Hoffman et al. | 174/52.4 |
| 5,371,043 | 12/1994 | Anderson et al. | 437/209 |
| 5,388,027 | 2/1995 | Pollock et al. | 361/705 |
| 5,412,340 | 5/1995 | Tanikoshi | 330/68 |
| 5,461,196 | 10/1995 | Virga et al. | 174/52.4 |
| 5,574,314 | * 11/1996 | Okada et al. | 257/728 |
| 5,616,886 | 4/1997 | Romero et al. | 174/52.4 |
| 5,760,473 | * 6/1998 | Dickson et al. | 257/728 |

OTHER PUBLICATIONS

Lee et al., A New Bonding Technology Using Gold and Tin Multilayer Composite Structures, IEEE Transactions on Components, Hybrids, and Manufacturing Technology, (Jun. 14, 1991) 407.*

High–G Support Frame Assembly, Griswold et al., United States Statutory Invention Registration, Reg. No. H1245, Filed Nov. 5, 1992, Published Oct. 5, 1993.

* cited by examiner

*Primary Examiner*—Andrew Tran
*Assistant Examiner*—Christian D. Wilson
(74) *Attorney, Agent, or Firm*—Robert F. Hightower

(57) ABSTRACT

A method for packaging a semiconductor device (23) to form a semiconductor component (10). A die attach material (17) is disposed on a flange (11). A semiconductor chip (23) is bonded to the die attach material (17). After disposing the die attach material (17) on the flange (11), an insulator material (28) is coupled to the flange (11). A leadframe (32) is coupled to the semiconductor chip (23) via a plurality of wirebonds (36). The wirebonds (36) and the semiconductor chip (23) are protected by a lid (37).

14 Claims, 2 Drawing Sheets

SEMICONDUCTOR COMPONENT AND METHOD FOR MANUFACTURING THE SEMICONDUCTOR COMPONENT

BACKGROUND OF THE INVENTION

The present invention relates, in general, to semiconductor devices and, more particularly, to semiconductor device packages.

Semiconductor transistor die are encapsulated for protection from damage by external stresses and to provide a means for carrying electrical signals to and from the devices. Included in the repertoire of semiconductor device package types are dual-in-line packages, pin grid array packages, TAB packages, multichip modules, and power packages. An important class of power packages is Radio Frequency (RF) power packages. These packages are typically used when the RF semiconductor transistor die dissipates power greater than ten watts and operates at frequencies greater than 100 megaHertz.

A power semiconductor device is typically comprised of a semiconductor die and a package or housing for the semiconductor die. The package includes a heatsink on which an insulator is bonded. Leads are then bonded to the insulator. The steps of bonding the insulator to the heatsink and bonding the leads to the insulator are typically performed at temperatures greater than 800° C. Subsequently, wirebonds are formed between the semiconductor die and the leadframe leads, and a lid is placed over the semiconductor die to protect it from external stresses. Because the steps of forming wirebonds and placing the lid over the semiconductor die are performed at temperatures around 450° C., any steps requiring higher processing temperatures, e.g., bonding the leadframe lead to the heatsink, are performed before the manufacturing steps that use lower processing temperatures. A drawback to this sequence of processing steps is that it complicates the manufacturing process, thereby decreasing the throughput and increasing the costs of manufacturing these devices. Another drawback that due to the differences between the coefficients of thermal expansion of the heatsink, the insulator, and the leads, the package becomes warped during its manufacture. Warped packages are unacceptable to the component manufacturers because of the difficulties they create in attaching the semiconductor transistor die to the package. Further, warped packages are unacceptable to end-users because the warpage diminishes the performance of the semiconductor devices and creates reliability issues.

Accordingly, it would be advantageous to have a power semiconductor component that does not have warped portions and a method for making the power semiconductor component. It would be of further advantage for the power semiconductor component to be cost efficient to manufacture and manufacturable with standard manufacturing techniques.

DETAILED DESCRIPTION OF THE DRAWINGS

The present invention provides a method for manufacturing semiconductor power packages, wherein the step of insulatively coupling the leads to the flange is performed at temperatures lower than those used to bond the semiconductor die to the flange. The method employs formation of a die attach material on the flange so that an electrically and thermally conducting bond such as for example, a eutectic bond, can be formed between a semiconductor chip and the flange before a leadframe is bonded to the flange. Bonding the semiconductor die to the flange in this fashion allows using lower temperature processing steps to insulatively attach the leads to the flange.

Figure 1:
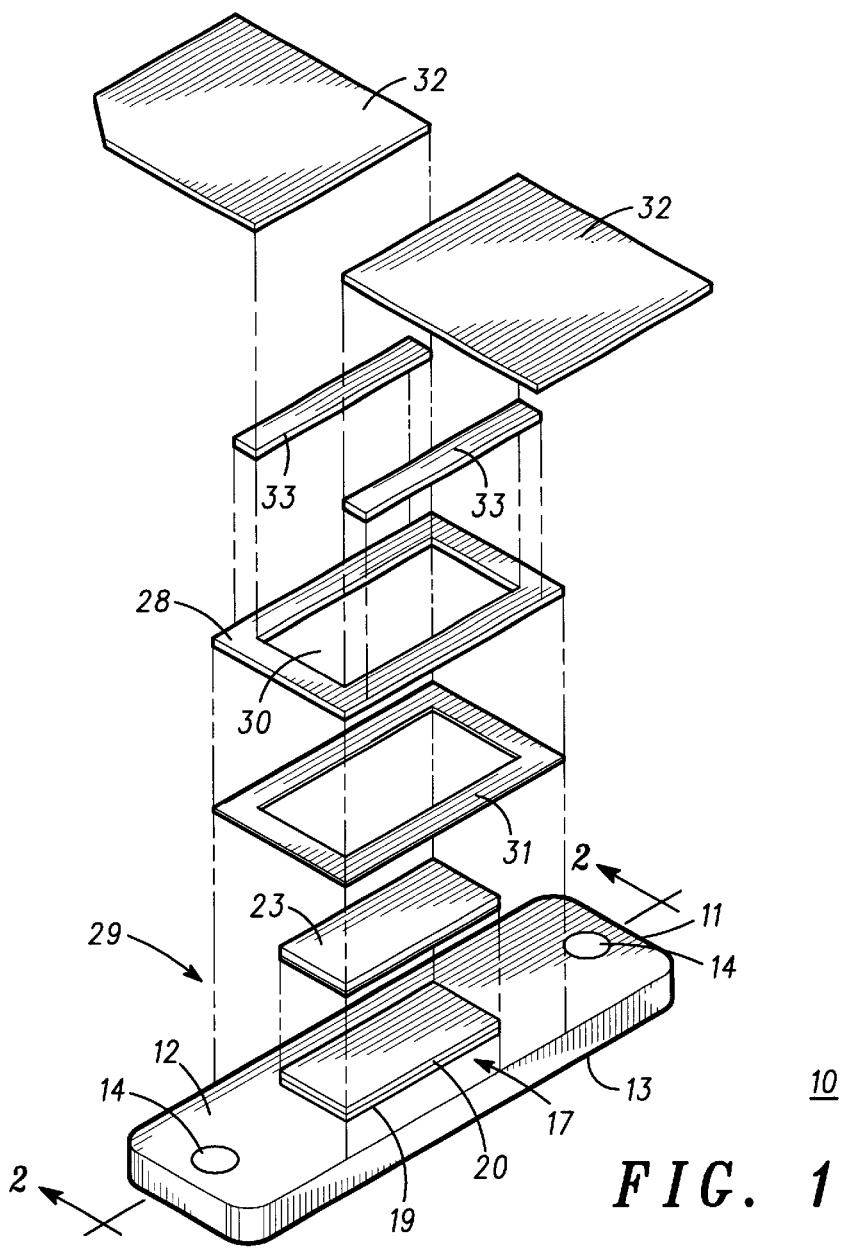
FIG. 1 is an exploded isometric view of a semiconductor component in accordance with an embodiment of the present invention.

FIG. 1 is an exploded isometric view of a semiconductor component 10 in accordance with an embodiment of the present invention. What is shown in FIG. 1 is a rectangularly shaped flange 11 having major surfaces 12 and 13 that have a flatness in the range of about 50 microns to about 1 micron across each surface. Preferably surfaces 12 and 13 have a flatness within 5 microns across each surface. In addition, flange 11 has fastening or mounting holes 14 that are used to facilitate the mounting of semiconductor component 10 to an electrical chassis or a heatsink. Although flange 11 is shown as being rectangular and having mounting holes 14, it should be understood that these are not limitations of the present invention. For example, flange 11 may not have any mounting holes or it may have mounting slots rather than mounting holes. Suitable materials for flange 11 include copper, alloys of tungsten and copper, laminates of copper and molybdenum, alloys of copper and molybdenum, and a metal matrix composite such as aluminum silicon carbide or copper and graphite fibers. By way of example, flange 11 is made from a combination of copper and tungsten. Thus, flange 11 is an electrically and thermally conductive structure which can serve as a heatsink.

A die attach material 17 is formed on a portion 18 of surface 12 using, for example, a plating process. Briefly referring to FIG. 2, a highly enlarged exploded cross-sectional view of flange 11 having die attach material 17 formed thereon is shown. It should be understood that the same reference numerals are used in the figures to denote the same elements. By way of example, die attach material 17 is comprised of a layer 19 of nickel formed on surface 12 and a layer 20 of gold formed on nickel layer 19. Nickel layer 19 may have a thickness ranging between approximately 1 micron and approximately 8 microns and gold layer 20 may have a thickness ranging between approximately 1 micron and approximately 5 microns. Typical thicknesses for nickel layer 19 and gold layer 20 are approximately 3 microns and approximately 2.5 microns, respectively. Other suitable materials for die attach material 17 include, but are not limited to, a combination of gold and tin, wherein the tin is formed on portion 18 of surface 12 and the gold is formed on the tin; lead and tin, wherein the tin is formed on portion 18 of surface 12 and the lead is formed on the tin; and organic materials such as electrically conductive epoxy or silver filled glass.

Figure 2:
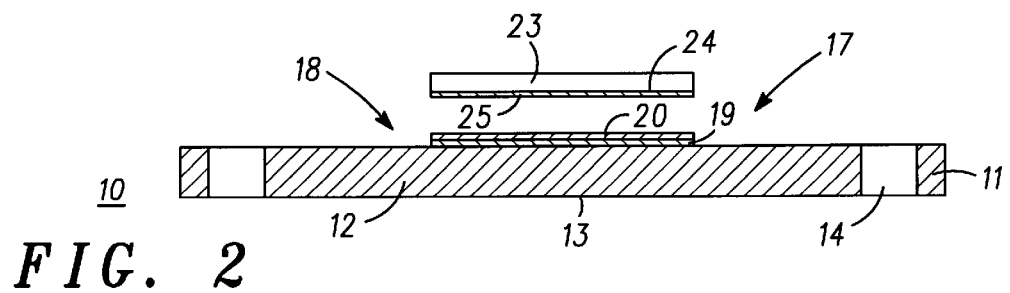
FIG. 2 is a highly enlarged exploded cross-sectional view taken along section line 2—2 of a portion of the semiconductor component of FIG. 1 during manufacture.

Still referring to FIG. 2, a semiconductor chip or die 23 having a surface 24 is shown. By way of example, semiconductor die 23 is an RF transistor die. A layer 25 of gold is disposed on surface 24. The thickness of gold layer 25 may range from approximately 0.1 microns to approximately 2 microns and is typically around 1.2 microns. Gold layer 25 is placed in contact with gold layer 20 and a combination of heat and mechanical agitation is used to form a eutectic bond. The bond may be formed at temperatures ranging between approximately 280 degrees Celsius (° C.) and approximately 500° C. and is typically formed at a temperature of approximately 430° C. when the gold-silicon eutectic is used. It should be understood that these temperatures are suitable for a gold-silicon eutectic system and that other temperatures may be more suitable for other metallization systems.

Referring again to FIG. 1, an electrically insulating material 28 is attached to a portion 29 of surface 12. By way of example, insulating material 28 is rectangularly shaped, ranges in thickness from about 0.1 microns to about 2 millimeters, and has an opening 30. In accordance with this embodiment, insulating material 28 is rectangularly shaped having an opening or window extending therethrough. Therefore, insulating material 28 is referred to as a window-frame. However, it should be understood this is not a limitation of the present invention. For example, insulating material 28 can be in the form of strips that are placed on surface 12. Suitable materials for insulating material 28 include organic polymers such as polyimides or epoxies, ceramics such as aluminum oxide ($Al_2O_3$) and aluminum nitride (AlN), printed circuit board material such as FR-4, or other similar materials. Insulating material 28 can be attached to portion 29 using, for example, solder 31, organic polymers such as epoxy, or the like.

A leadframe 32 is attached to insulating material 28 via a solder 33. By way of example, leadframe 32 is made from an iron-nickel alloy and has a thickness ranging from approximately 0.1 millimeters to approximately 0.4 millimeters. A layer of nickel (not shown) is plated on those portions 33 of leadframe 32 to which wirebonds will be bonded. Then a layer of gold (not shown) or another suitable material for wirebond attachment is formed on the nickel layer. Other suitable materials for leadframe 32 include copper alloys and iron-nickel-cobalt alloys. Leadframe 32 provides leads to the semiconductor device and is therefore also referred to as a lead or leads or an electrode or electrodes.

Figure 3:
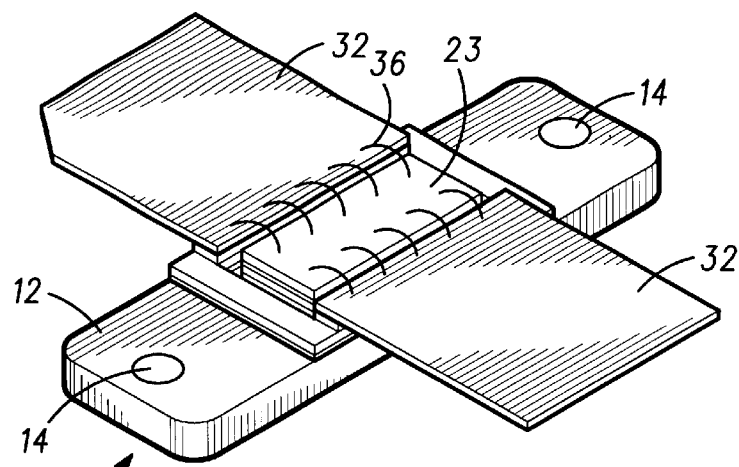
FIG. 3 illustrates the semiconductor component of FIG. 1 at a later stage of manufacture.

FIG. 3 illustrates semiconductor component 10 at a later stage of manufacture. Wirebonds 36 are formed between semiconductor chip 23 and leadframe 32. Techniques for forming wirebonds are well known to those skilled in the art.

Figure 4:
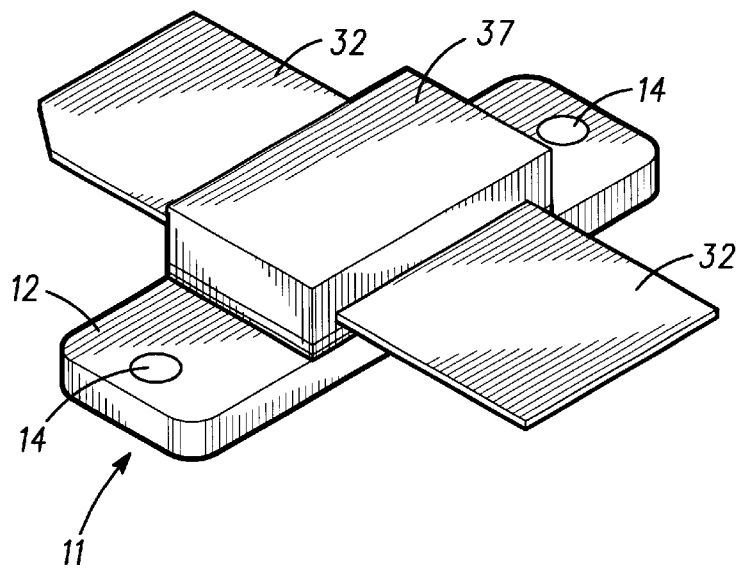
FIG. 4 illustrates the semiconductor component of FIG. 3 at yet a later stage of manufacture.

FIG. 4 illustrates semiconductor component 10 at a later stage of manufacture. A lid or cap 37 is bonded to insulating material 28 and leadframe 32 using techniques known to those skilled in the art. Cap 37 protects semiconductor chip 23 and wirebonds 36 from physical and environmental stresses. Although not shown, cap 37 may have a recessed portion to accommodate wirebonds 36. It should be understood that the coupling of cap 37 is not a limitation of the present invention. In other words, cap 37 can be bonded to both insulating material 28 and leadframe 32 or it can be bonded only to insulating material 28 or only to leadframe 32 or to flange 11.

By now it should be appreciated that a power semiconductor component and a method for manufacturing the power semiconductor component have been provided. An advantage of the method of the present invention is that the semiconductor chip is metallically bonded to a flange prior to attaching a leadframe to the flange. This permits the use of lower temperature manufacturing steps for attaching the leadframe and insulation to the flange resulting in an ability to maintain the flatness of the individual components after assembly of the individual components. In accordance with the present invention, the flatness of flange 11 after bonding the leads and semiconductor die thereto, i.e., after manufacturing, ranges between approximately 10 microns and approximately 50 microns. Another advantage is that multiple semiconductor chips can be attached to the flange, which increases the versatility of the semiconductor components. In addition, the present invention allows the use of pick and place processing as well as singulated units during the packaging step. This lowers cost and increases the throughput of the manufacturing operation. A further advantage is the ability to selectively place differing metals on the package surfaces.

While the invention has been described in specific embodiments thereof, it is evident that many alterations, modifications, and variations will be apparent to those skilled in the art. Further, it is intended to embrace all such alterations, modifications, and variations in the appended claims. For example, the semiconductor die can be bonded to the flange to form a first sub-component and the leads can be bonded to the insulator to form a second sub-component. Then, the first and second subcomponents can be bonded together. This embodiment allows coupling the second component, i.e., the lead-insulator combination, to the flange at a temperature that is lower than the temperature used to bond the semiconductor die to the flange.

What is claimed is:

1. A method for manufacturing a semiconductor component, comprising the steps of:
    providing a flange having first and second major surfaces and a flatness within 25 micrometers across the first and second major surfaces;
    forming a die attach material on a first portion of the first major surface;
    coupling a semiconductor chip to the first portion of the first major surface;
    insulatively coupling a leadframe to a second portion of the first major surface, wherein the flatness across the first and second major surfaces remains within 25 micrometers after performing the step of insulatively coupling the leadframe; and
    coupling the semiconductor chip to the leadframe.

2. The method of claim 1, further including covering the semiconductor chip.

3. The method of claim 2, wherein the step of covering the semiconductor chip includes coupling a cap to the leadframe, wherein a material of the cap is selected from the group ceramic, metal, and organic material.

4. The method of claim 2, wherein the step of covering the semiconductor chip includes applying a mold compound over the semiconductor chip.

5. The method of claim 1, wherein the step of providing the flange includes providing the flange that is made from a material selected from the group of alloys of tungsten and copper, laminates of copper and molybdenum, alloys of copper and molybdenum, copper, copper graphite, and a metal matrix composite.

6. The method of claim 1, wherein the step of coupling the semiconductor chip includes bonding the semiconductor chip to the first portion of the first major surface at a temperature less than approximately 450 degrees Celsius by forming an electrically and thermally conductive bond.

7. The method of claim 6, wherein the step of bonding includes forming a eutectic bond.

8. The method of claim 7, wherein the step of eutectically bonding includes forming one of a gold-silicon eutectic bond or a gold-tin eutectic bond.

9. The method of claim 7, wherein the step of coupling the semiconductor chip includes providing the semiconductor chip having a major surface and gold disposed on the major surface.

10. The method of claim 1, wherein the step of insulatively coupling the leadframe includes:

coupling an electrically insulating material to the second portion of the first major surface; and coupling a leadframe to the insulating material.

11. The method of claim 10, wherein the step of coupling the electrically insulating material includes bonding an insulating material to the second portion of the first major surface, wherein the insulating material is selected from the group aluminum oxide, aluminum nitride, ceramic material, and organic polymers.

12. The method of claim 10, further including selectively forming one of gold or an alloy of nickel and palladium on portions of the leadframe.

13. The method of claim 1, wherein the step of coupling the semiconductor chip to the leadframe includes wirebonding the semiconductor chip to the leadframe.

14. The method of claim 1, further including the step of selectively forming the die attach material on the first major surface.

* * * * *